United States Patent
Donaldson et al.

(10) Patent No.: US 7,259,974 B2
(45) Date of Patent: Aug. 21, 2007

(54) INTEGRATED FLOATING POWER TRANSFER DEVICE WITH LOGIC LEVEL CONTROL AND METHOD

(75) Inventors: William Donaldson, Sunnyvale, CA (US); Edmond Toy, Sunnyvale, CA (US)

(73) Assignee: NXP B.V., Eindhoven (NL)

(*) Notice: Subject to any disclaimer, the term of this patent is extended or adjusted under 35 U.S.C. 154(b) by 344 days.

(21) Appl. No.: 10/535,554

(22) PCT Filed: Nov. 14, 2003

(86) PCT No.: PCT/IB03/05178

§ 371 (c)(1),
(2), (4) Date: May 18, 2005

(87) PCT Pub. No.: WO2004/047295

PCT Pub. Date: Jun. 3, 2004

(65) Prior Publication Data

US 2005/0285665 A1    Dec. 29, 2005

Related U.S. Application Data

(60) Provisional application No. 60/427,410, filed on Nov. 18, 2002.

(51) Int. Cl.
*H02M 3/18* (2006.01)
*G05F 3/16* (2006.01)

(52) U.S. Cl. .......... 363/60; 307/110; 327/536
(58) Field of Classification Search .......... 363/59, 363/60; 307/110; 327/536
See application file for complete search history.

(56) References Cited

U.S. PATENT DOCUMENTS

| | | | |
|---|---|---|---|
| 4,807,104 A | | 2/1989 | Floyd et al. |
| 5,491,623 A | * | 2/1996 | Jansen .......................... 363/60 |
| 5,581,454 A | * | 12/1996 | Collins .......................... 363/59 |
| 5,808,502 A | | 9/1998 | Hui et al. |
| 5,909,139 A | | 6/1999 | Williams |
| 6,052,019 A | | 4/2000 | Kwong |
| 6,198,645 B1 | * | 3/2001 | Kotowski et al. .............. 363/59 |
| 6,424,202 B1 | * | 7/2002 | Bartlett ........................ 327/536 |

* cited by examiner

*Primary Examiner*—Gary L Laxton

(57) ABSTRACT

A switch control circuit (416, 402, 418, 422) and method are provided for transistor-implemented switches (405, 413, 408, 414) of an integrated floating power transfer device (400, 500). The device includes a floating bus (403, 410) driven by a power system which includes a charge pump circuit (419, 408, 414, 420). At least one switch circuit (405, 413) is coupled to the floating bus and the power system for facilitating charging of the floating bus. The switch control circuit (416, 402, 418, 422) includes a level shifting circuit (402) for adjusting a control signal to the at least one switch circuit notwithstanding floating of an input voltage signal thereto to facilitate operation of the switch circuit.

18 Claims, 5 Drawing Sheets

INTEGRATED FLOATING POWER TRANSFER DEVICE WITH LOGIC LEVEL CONTROL AND METHOD

This application claims the benefit of U.S. Provisional Application No. 60/427,410, filed Nov. 18, 2002, as well as U.S. Provisional Application No. 60/427,422, filed Nov. 18, 2002. Each of these provisional applications is hereby incorporated by reference herein in its entirety.

The present invention relates in general to power transfer devices, and more particularly, to a switch control circuit and method with dynamic logic level control adjustment for transistor-based switches of an integrated floating power transfer device.

Many system designs include power conversion circuitry to develop a required operating voltage. One such power conversion circuit is known as a charge pump. A charge pump is a device for creating increases in supply voltage or for inverting a supply voltage to generate a split supply. Many of these devices are related to applications using non-volatile memory circuits, which require a high voltage for programming. In a conventional charge pump power conversion circuit, the load device connects so that one terminal thereof is common to one of the supply terminals, typically the ground reference. U.S. Letters Pat. No. 4,807,104 discloses a power conversion circuit which is both a voltage multiplying and inverting charge pump. However, the output of the power conversion circuit remains referenced to the ground node.

In certain system implementations, it may be advantageous to power the system using a floating power transfer device. By floating the power transfer device, if a terminal in the system were to short, then the system may still be able to continue to operate. For example, in an automobile bus network, the signaling portion of the system on the bus could be floating relative to any other reference, such as ground or battery positive. This would provide enhanced fault tolerance by allowing communications to still occur notwithstanding a short at a terminal thereof.

The shortcomings of the prior art are overcome and additional advantages are provided by the provision of a floating power transfer device which includes a floating bus, and a power system for driving the floating bus. The power system includes a charge pump circuit. The device further includes at least one switch circuit coupled to the floating bus and the power system for facilitating charging of the floating bus, and at least one switch control circuit for controlling switching of the at least one switch circuit. In operation, a voltage signal at an input of the at least one switch circuit comprises a floating signal, and the at least one switch control circuitry includes a level shifting circuit for dynamically adjusting a logic level control signal to the at least one switch circuit to facilitate operation of the at least one switch circuit.

In another aspect, a circuit is provided which includes a first switch circuit for electrically coupling to a high side bus node of a floating bus, and a second switch circuit for electrically coupling to a low side bus node of the floating bus, wherein the first switch circuit and the second switch circuit comprise complementary circuits for controlling charging of the floating bus by a power system. The first switch circuit employs a first reference signal and the second switch circuit employs a second reference signal, both of which are floating when the first switch circuit and the second switch circuit are ON. The circuit further includes at least one switch control circuit for controlling switching of the first switch circuit and the second switch circuit. The at least one switch control circuit includes devices for dynamically adjusting logic level control signals to the first switch circuit and to the second switch circuit to facilitate operation thereof and provide protection to the first switch circuit and the second switch circuit.

In a further aspect, a method of controlling powering of an integrated floating power transfer device is provided. This method includes: providing a first switch circuit for electrically coupling to a high side bus node of a floating bus and a second switch circuit for electrically coupling to a low side bus node of the floating bus, wherein the first switch circuit and the second switch circuit comprise complementary switch circuits for controlling charging of the floating bus by a power system; providing, when in use, a first reference signal for the first switch circuit and a second reference signal for the second switch circuit, wherein the first reference signal and the second reference signal are both floating when the first switch circuit and the second switch circuit are ON; and providing a first logic level control signal to the first switch circuit and a second logic level control signal to the second switch circuit, wherein the first logic level control signal and the second logic level control signal are both translated control signals relative to a value of at least one of the floating first reference signal and the floating second reference signal, to facilitate operation of the first switch circuit and the second switch circuit and provide protection thereto.

Additional features and advantages are realized through the techniques of the present invention. Other embodiments and aspects of the invention are described in detail herein and are considered a part of the claimed invention.

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 4:
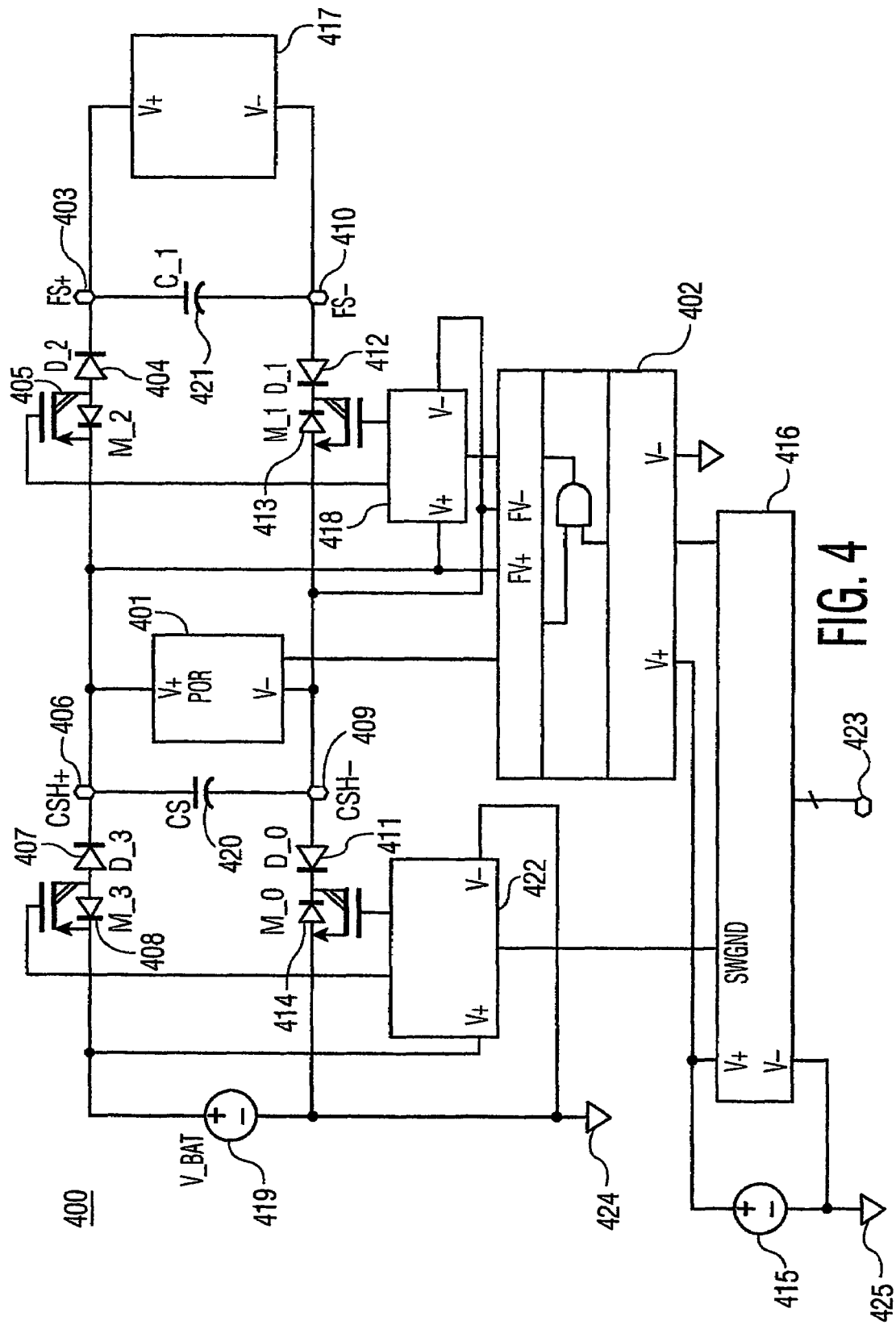
Figure 5:
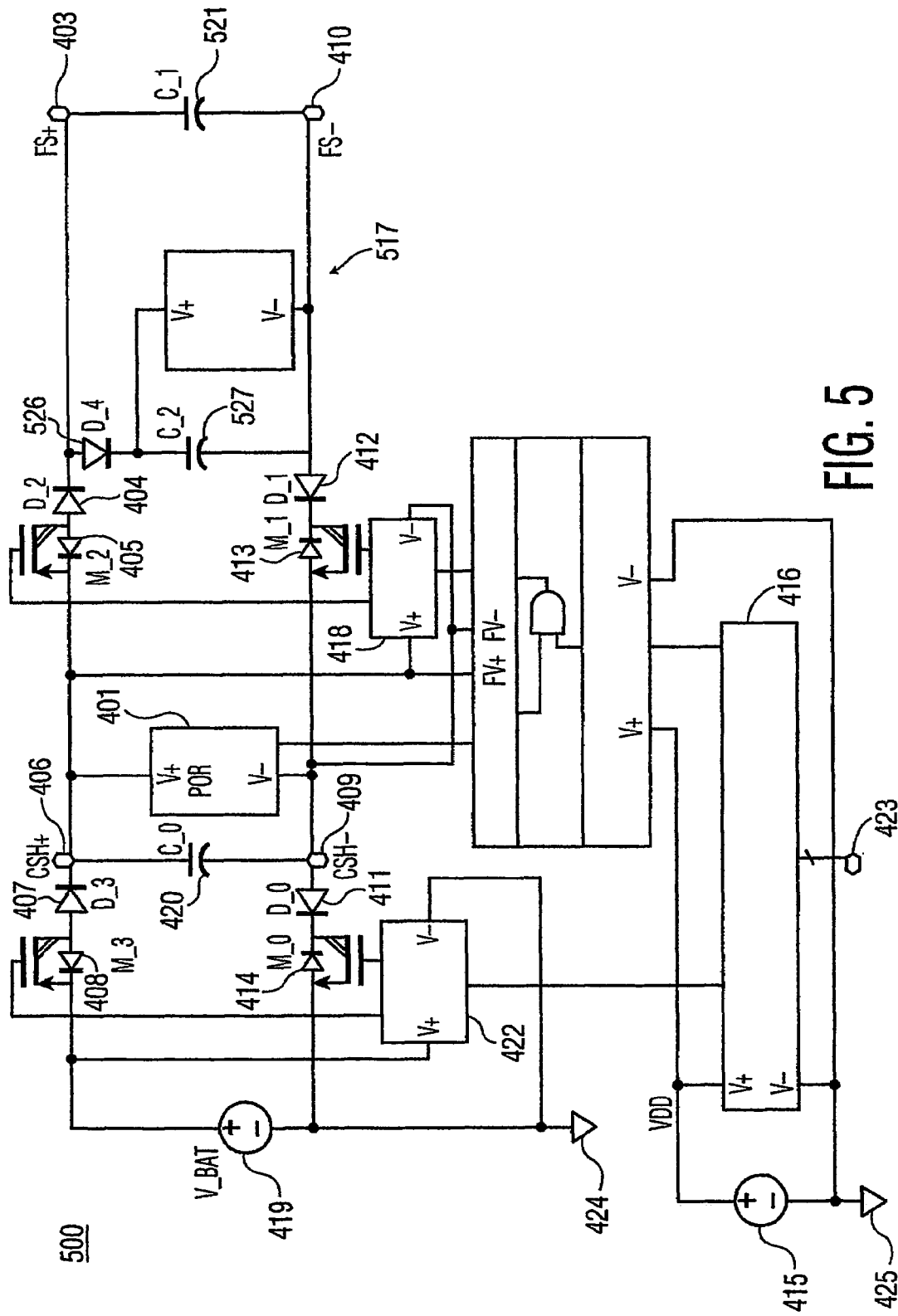

FIG. 4 is a schematic of one embodiment of an integrated floating power transfer device having a logic level control circuit providing dynamic voltage adjustment for a given logic level to be applied to transistor-based switches, in accordance with an aspect of the present invention; and FIG. 5 is a schematic of an alternate embodiment of an integrated floating power transfer device which enables the dual function of power and data transfer on the floating bus, and has a logic level control circuit providing dynamic voltage adjustment for a given logic level to be applied to the transistor-based switches, in accordance with an aspect of the present invention.

Figure 1:
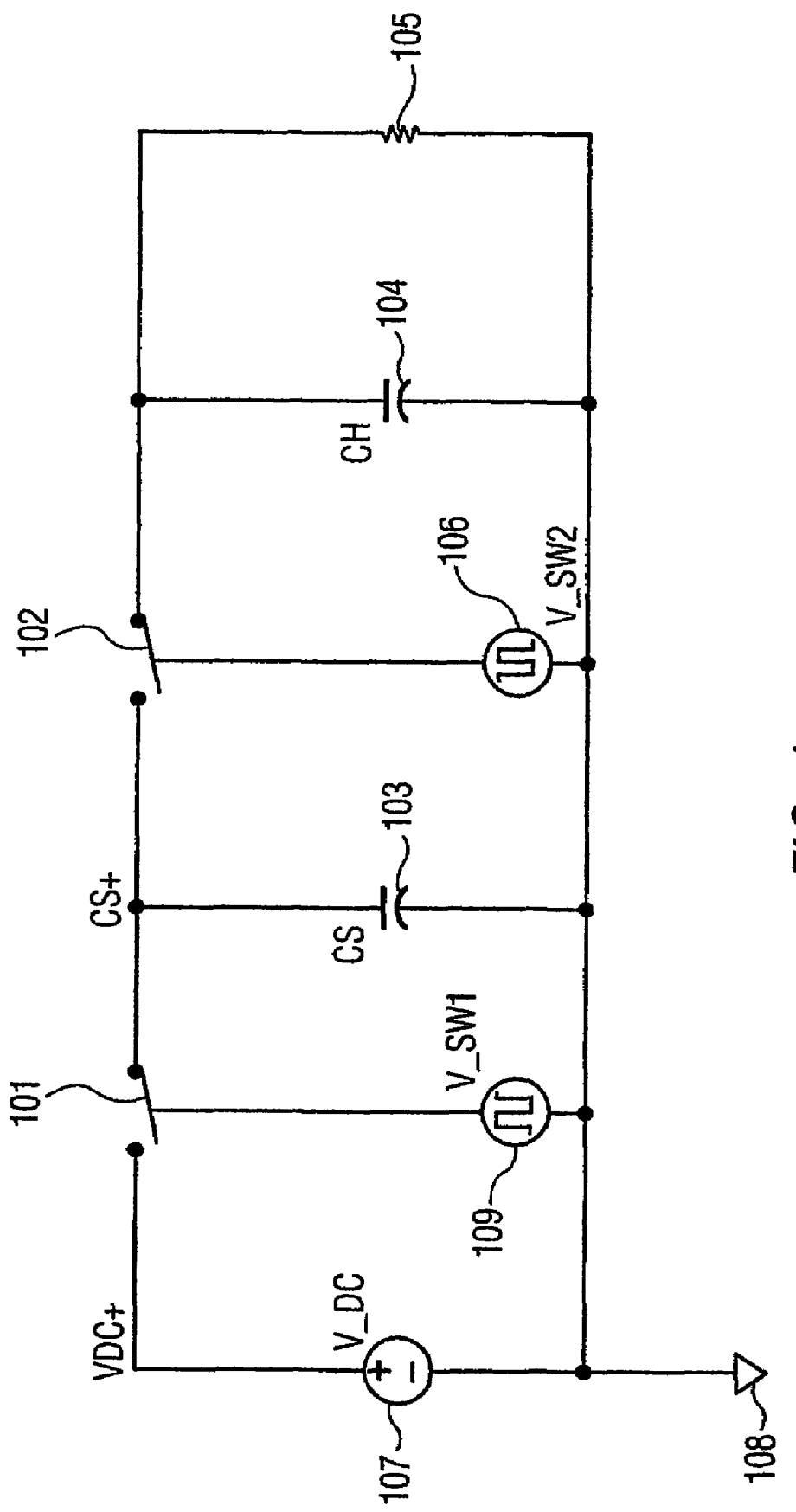
FIG. 1 is a schematic of one embodiment of a power transfer device.

Reference is now made to the drawings, wherein the same reference numbers used throughout different figures designate the same or similar components. One embodiment of a power transfer device for powering a load 105 is shown in FIG. 1. In this charge transfer embodiment, there is shown at least one common connection between the two supply domains allowing voltage inversion or voltage doubling, in addition to simple voltage isolation. The circuit operates by transferring charge from the grounded 108 power supply 107, through switch 101, onto a first reservoir capacitor CS 103. The state of switch 101 is controlled by a signal source V_SW1 109, which creates a pulse waveform for controlling the switch. Charge accumulated on capacitor CS 103 is transferred to an output capacitor CH 104 by enabling a second switch 102, which is controlled by a second signal source V_SW2 106. A continuous supply of power to load 105 is facilitated by providing correct pulse sequences from signal sources 106 and 109. The final output voltage across load 105 primarily depends on the switching frequency of signal sources 106 and 109, as well as the value of the reservoir capacitor CS 103, and the current through the load 105. The basic charge transfer circuit of FIG. 1 shows a well-known technique used in voltage conversion circuits for substrate biasing and high-voltage generation used in programming E²ROM devices.

A "floating supply" is a power-supply that has no direct connection to a local ground reference. A battery may be used to accomplish this, but it suffers from a limited lifetime. Alternatively, a transformer may be used to transfer AC power, which is then rectified to create a floating DC supply. This would require the generation of an AC signal, from the assumed existence of a DC voltage-supply, with sufficient strength to deliver the required power into the floating load. For certain applications, transformers are considered undesirable and bulky so other solutions are necessary. In these cases, an integrated solution is advantageous.

Figure 2:
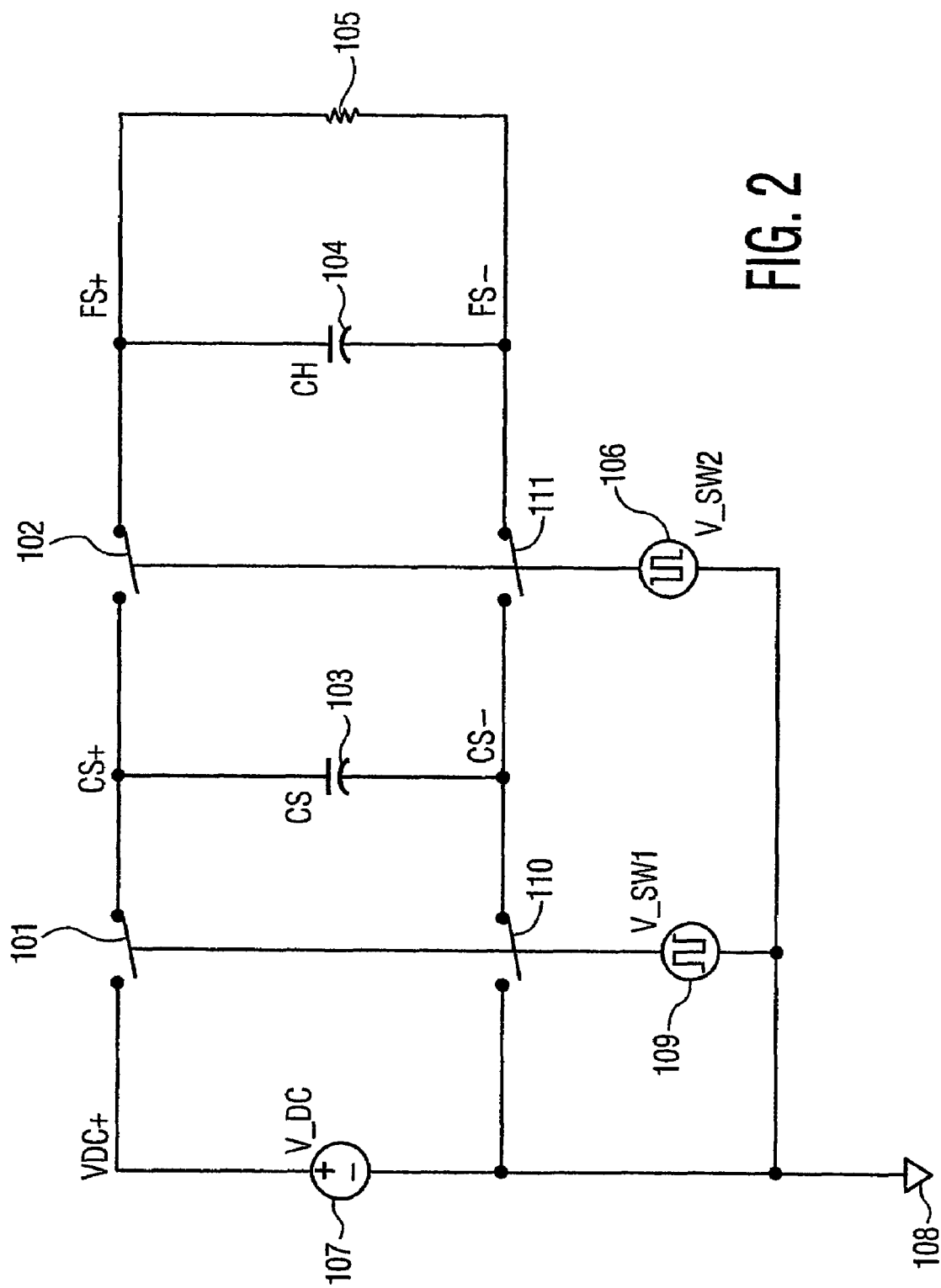
FIG. 2 is a schematic of one embodiment of a floating power transfer device.

A floating supply version of the circuit of FIG. 1 is depicted in FIG. 2. In this version, an additional pair of switches is provided to isolate the ground reference 108 from the load 105. This charge transfer device delivers charge onto capacitor CS 103 through switches 101, 110 under control of a signal generator V_SW1 109. Charge is provided by a power-supply voltage (V_DC) 107, one side of which is referenced to ground 108. Capacitor CH 104 provides the modified power supply for load 105. Capacitor 104 is charged from the voltage of capacitor CS 103 when switches 102, 111 are closed by a second signal generator V_SW2 106. The floating supply circuit of FIG. 2 allows node CS− to float during the charge transfer between capacitor CS 103 and capacitor CH 104. Switch 110 isolates the CS− node from ground. It is possible for the load negative (FS−) to float to any voltage relative to the ground reference, while power to the load 105 is delivered through the switch network.

In one embodiment, an integrated circuit (IC) implementation of the floating supply can replace the switches with MOS transistors. The range that the load may float in such a circuit would be limited by a requirement that the IC substrate be connected to the most negative voltage, and the most positive connection should not exceed the junction breakdown voltage of the transistors. These requirements limit the voltage isolation possible using conventional CMOS processes.

Figure 3:
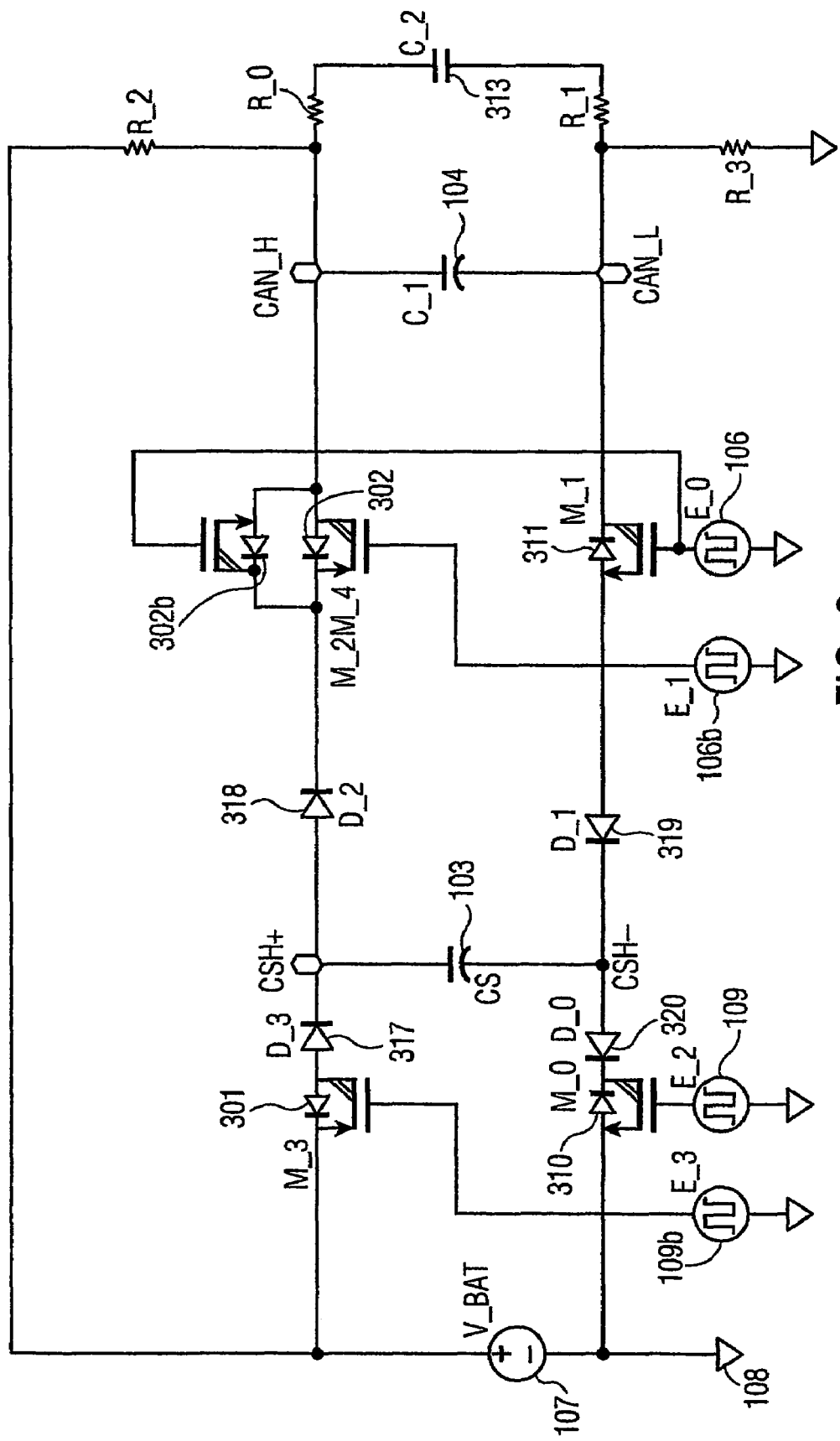
FIG. 3 is a schematic of one embodiment of a transistor-based, integrated circuit implementation of a floating power transfer device.

A floating charge transfer circuit such as shown in FIG. 2 can be used for signal transfer functions within a limited voltage range restricted by the ground reference supply voltage. Another approach is depicted in FIG. 3, wherein the circuit is used to transfer a mixture of data and power to a floating bus, denoted by CAN_H and CAN_L. With this circuit, a two wire 'controller area network' (CAN) driver is created. This apparatus can use DMOS switch transistors instead of MOS transistor base switches. A DMOS device can tolerate larger voltages across the switch terminals, thereby allowing the switch to operate beyond the normal supply limits.

To restate, FIG. 3 is an integrated circuit implementation of a floating power transfer device with a combined power and data feature. In this implementation, switches 101, 110 and 102, 111 of FIG. 2 are replaced by DMOS transistors 301, 310 and 302, 311, which are P type and N type transistors. These devices require the addition of diodes 317, 318, 319, 320 to maintain the isolation of the floating bus CAN_H and CAN_L from the source voltage 107 and ground 108. Signal generators 106, 109 now require additional complementary control sources 109b, 106b to drive the P-type DMOS transistor switches 301, 302 (with the N-type DMOS transistor switches 310, 311 being driven by control sources 109, 106, respectively). Typically, the control sources are driven by digital signals, biased at the prevailing logic-supply voltage, with the same phasing as described above in connection with the floating power transfer device of FIG. 2.

Power is again available in this implementation from the floating circuit due to energy retained by the hold capacitor CH 104. Capacitor 313 is depicted as an example of signal capacitance, which is isolated from the floating bus by resistors R_0 and R_1. Resistors R_2 and R_3 represent parasitic resistances representative of a certain leakage current through the system. Transistor 302b is shown in this embodiment as a way of enhancing the ON switch resistance of the device. This transistor enables the switch to be ON for starting up the system. When the voltage across CAN_H is low, meaning that the voltage across capacitor 104 is low, transistor 302b is used at startup to deliver charge onto capacitor 104. This startup transistor is optional depending upon the particular implementation.

Operationally, when a signal appears on the floating bus during the data phase, it may drive the bus voltage to 0V or some other predetermined intermediate value. For the remainder of this phase, the bus is held at that value. At the commencement of the power-phase, the bus transistor switches 302, 311 turn on and the bus voltage is restored to the power level. In this system, the speed at which the bus voltage changes is dependent in the impedance of the switches 302, 311 and diodes 318, 319 conducting current from the hold capacitor onto the floating bus.

In one aspect, provided herein is a power transfer device which delivers power from a DC supply to a floating DC supply with active components of the circuit designed within a single integrated circuit. This approach eliminates the need for a transformer to provide a supply that is independent of the local ground reference. One application of this circuit would allow the development of in-car systems that can remain functional in the presence of a short between one floating supply terminal and any other power supply present within the car. Such a device is able to deliver sufficient power into the load of the floating system to maintain a supply voltage that is constant for the purposes of the load devices. In practice, the voltage may show a ripple as the reservoir capacitors are recharged and the average voltage may vary as the load changes. Suitable choice of external capacitor values is anticipated to keep variation within acceptable bounds.

FIG. 4 depicts one embodiment of an integrated floating power transfer device having logic level control circuitry in accordance with aspects of the present invention. Advantageously, this circuit provides a floating supply that is capable of positive and negative variation with respect to the local ground over a greater range than is possible using standard (C)MOS circuits. The output may be used in either a "supply only" or a dual "supply and signaling" scheme. The circuit incorporates logic level based inputs to control all switching devices. This is achieved using a level-shifting circuit that is capable of transferring logic signals relative to the floating reference node. Further, the circuit of FIG. 4 disables the output switches 405, 413 when the voltage on the reservoir capacitor 420 is insufficient to supply the output. This allows the reservoir capacitor to be precharged without the charge leaking through the output switch devices. Diodes 404 and 412 are shown connected between switches 405 and 413 and output nodes 403 and 410, respectively. This placement of diodes improves on the prior implementation of FIG. 3 by ensuring that the switch transistor 405 and 413 sources are connected to the nodes CSH+ 406 and CSH− 409. The gates of these switches are driven by a level translation block 418. This block derives its power supply from the same nodes (CSH+, CSH−), as explained further below, so that the gate levels are referenced to the same supply levels as the sources. The use of DMOS transistor switches within the circuit allows the floating range of operation to be determined by the drain-source breakdown voltage of the DMOS transistors. In certain technologies, this may be significantly larger than existing supply voltages and can include protection against shorts to AC power sources as well as DC sources. A ground based logic block provides an interface to a microprocessor or other internal or external logic circuit. This logic may generate a simple timing sequence, in which case the final load voltage may vary as the load current changes, or it may adjust the timing sequence to provide regulation of the load voltage. Further, the circuit of FIG. 4 can operate with a power supply voltage which is greater than the gate breakdown voltage of the switch DMOS transistors.

As noted, FIG. 4 depicts one embodiment of a circuit 400 for generating a floating DC power supply. This circuit allows the operation of the switch devices that facilitate power transfer from a grounded 424 reference DC supply 419 to the floating load 417. One feature of this circuit is that timing signals are generated by a logic block 416 that is driven off a local logic-supply 415, and uses a common ground reference 425. The logic supply voltage can be any value that is acceptable for the intended application, usually between 2.7V −5V. The logic interface signals 423 may be connected externally to some controlling device, or internally to other integrated circuit logic elements.

Control signals of sufficient voltage level are needed to control the DMOS switch transistors to maximize sufficient transfer of charge to the load. Each of the four DMOS transistors 405, 408, 413, 414 of the circuit of FIG. 4 requires a unique control signal. The power supply voltage 419 may be higher than the gate breakdown voltage of the DMOS switch transistors. Control signals are translated in the circuit to signal levels that are limited to voltages that lie within the acceptable operating range of the DMOS transistor gates. The level translators 418, 422 provide outputs that do not exceed the gate breakdown voltage when driven by the normal logic level on the input. The P-DMOS switches 405, 408 require a gate signal that is referenced to that device's source terminal. In the case of switch 408, the gate control voltage ranges between V_BAT and V_BAT−$V_{GATE(MAX)}$, it does not swing to ground unless V_BAT is less than $V_{GATE(MAX)}$ For the N-DMOS switch 414, the gate control signal varies between 0V and $V_{GATE(MAX)}$. As used herein, the term $V_{GATE(MAX)}$ is a symbolic representation of a physical limitation normally present in MOS semiconductor devices, such that a voltage applied to the gate terminal that is greater than $V_{GATE(MAX)}$ would cause damage to the device.

While switches 408, 414 are driven by ground reference signals that are translated to an appropriate gate drive level by level translation block 422, the switches on the floating side 405, 413 need to be driven from signals referenced to nodes CSH+ 406 and CSH− 409. A level translation block 418 provides a similar function as block 422, except that it is referenced to node CSH− 409 and powered from node CSH+ 406. The logic level input to level translation block 418 is no longer referenced to ground. Thus, an additional level shifting circuit 402 is provided to perform dynamic level shifting between the two voltage domains. This circuit can transfer a logic level signal while the reservoir capacitor CS 420 is switched between the grounded supply and the floating supply. It can accommodate offsets of either positive or negative voltages. Further details of level shifting circuits are provided in U.S. Pat. No. 6,452,418, as well as the above-incorporated U.S. provisional application No. 60/427, 422, entitled "Level Shifting Circuit Between Isolated Systems".

Certain integrated circuit (IC) processes create an implicit reverse biased diode between the source and drain terminals of the DMOS switches. When this is the case, as in the embodiment of FIG. 4, blocking diodes 404, 407, 411, 412 are inserted between the switches and the output nodes. In the circuit example of FIG. 3, diodes 318, 319 and DMOS devices 302, 311 are shown transposed. The embodiment of FIG. 4 is an improvement over that circuit because of an improved gate control facilitated by positioning the DMOS source terminals at the same potential as the reservoir capacitor 420, i.e., at nodes CSH− 409 and CSH+ 406. The level translation block 418 that drives the gates of switches 405 and 413 also has its power supply connections between CSH− and CSH+. Operationally, when signal SWGND of control logic 416 is a logic one, then level translation block 422 provides an appropriate gating signal to switches 408 and 414 to turn ON and deliver charge from grounded power supply 419 onto the reservoir capacitor CS 420 through diodes 407 and 411. Once the desired voltage is generated across the reservoir capacitor 420, power is switched from the reservoir capacitor 420 to a holding capacitor 421 which will power floating load 417.

Switches 413, 405 are on the floating side of the power transfer device and are referenced to nodes CSH− and CSH+. The control signals which drive these two transistors can be generated in the same way as for transistors 408 & 414, however, the reference for the level translation block is derived from across the capacitor 420, such that capacitor 420 looks like the power supply for level translation block 418. In this way, the control signal into block 418 is not relative to ground. Level shifting block 402 provides translation of the digital input control signal relative to a chosen floating supply value, in this case, CSH−. When the correct gate drive voltages for transistors 405 and 413 are established, the transistors switch ON transferring charge from reservoir capacitor 420 to holding capacitor 421 through diodes 404 and 412. Once charge is available on capacitor 421, the floating load may be powered.

In FIG. 4, a power on reset circuit 401 is also provided which ensures that the switches are not turned ON while the voltage across the reservoir capacitor 420 is insufficient to maintain power control of the devices. For example, if the voltage across the reservoir capacitor is less than a predetermined value, then the power on reset logic will not provide an ENABLE signal back to the level shifting block 402, which includes an AND circuit that requires the ENABLE signal to be present in order for a logic level one control signal to be provided to level translation block 418.

In one practical implementation, reservoir capacitor 420 and floating supply capacitor 421 of FIG. 4 may be external to the integrated circuit, though other embodiments could employ on-chip capacitors.

The circuit 500 shown in FIG. 5 extends the concepts of FIG. 4 to allow output nodes FS+ 403 and FS− 410 to form part of a switched bus scheme (similar to the circuit of FIG. 3 discussed above). Capacitor 421 in this example is smaller and cannot be used to retain the charge required for the floating supply. Thus, an additional diode 526 and capacitor 527 provide the reservoir required by the floating supply. Diode 526 prevents capacitor 527 from discharging while the bus voltage across FS+ 403 and FS− 410 is lower than the voltage FSUP across the floating load 517. In this example, floating load 517 may include the supply to the circuits that create the bus signals between nodes FS+ and FS−.

Power on reset (POR) block 401 again monitors the voltage level across reservoir capacitor 420. If POR 401 detects that a voltage has fallen below a specified level, then it is able to switch off the output DMOS switches 405, 413 to protect against additional leakage of charge out of the reservoir capacitor 420. This can be used to protect the input DMOS switches 408, 414 from excessive power dissipation, which may occur with a low voltage on the reservoir capacitor 420.

Additional variations to the circuit embodiments described above may include other configurations of diodes and switches. One such example would connect the sources of all switches to their respective terminals on the reservoir capacitor 420. Another alternative embodiment would move the source connections of switches 405 and 413 from the CSH+ and CSH− nodes to the floating supply nodes FS+ and FS−, respectively.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A device comprising: a floating bus; a power system for driving the floating bus, the power system comprising a charge pump circuit; at least one switch circuit coupled to the floating bus and the power system for facilitating charging of the floating bus; at least one switch control circuit for controlling switching of the at least one switch circuit; and wherein a voltage signal at an input of the at least one switch circuit is floating, and wherein the at least one switch control circuit includes a level shifting circuit for adjusting a control signal level to the at least one switch circuit to facilitate operation of the at least one switch circuit.

2. The device of claim 1, wherein the at least one switch circuit comprises at least one transistor-based switch circuit, and wherein the voltage signal comprises a source input to the at least one transistor-based switch circuit, and the control signal comprises a gate input to the at least one transistor-based switch circuit.

3. The device of claim 2, wherein the at least one switch circuit comprises a first switch circuit and a second switch circuit, the first switch circuit comprising at least one P type transistor circuit, and the second switch comprising at least one N type transistor circuit, and wherein the first switch circuit and the second switch circuit comprise complementary circuits.

4. The device of claim 1, wherein the at least one switch control circuit further comprises a level translation circuit, the level shifting circuit adjusting an input control signal to the level translation circuit based on a potential of the floating voltage signal.

5. The device of claim 1, wherein the power system comprises a power and data system, and wherein output of the device is across the floating bus and comprises both a floating power output and a floating signal output.

6. The device of claim 1, wherein the floating bus comprises a floating DC bus, and wherein the device comprises an integrated circuit employing multiple transistor and diode pairs.

7. The device of claim 1, wherein the power system further comprises a reservoir capacitor, and wherein the voltage signal comprises a potential across the reservoir capacitor, and the level shifting circuit adjusts the control signal level with reference to the potential at one terminal of the reservoir capacitor.

8. The device of claim 7, further comprising a power on reset protection circuit for monitoring the potential across the reservoir capacitor, and if the potential falls below a specified level, then for switching off the at least one switch circuit to inhibit leakage of charge from the reservoir capacitor.

9. The device of claim 1, wherein the floating bus comprises a balanced bus system having a high side bus node and a low side bus node, and wherein the at least one switch circuit comprises a first switch circuit and a first diode connected to the high side bus node and a second switch circuit and a second diode connected to the low side bus node.

10. A circuit comprising: a first switch circuit for electrically coupling to a high side bus node of a floating bus, and a second switch circuit for electrically coupling to a low side bus node of the floating bus, wherein the first switch circuit and the second switch circuit comprise complementary circuits for controlling charging of the floating bus by a power system ,and wherein a first reference signal for the first switch circuit and a second reference signal for the second switch circuit are floating when the first switch circuit and the second switch circuit are ON; and at least one switch control circuit for controlling switching of the first switch circuit and the second switch circuit, the at least one switch control circuit including logic for adjusting a control signal level to the first switch circuit and to the second switch circuit to facilitate operation thereof and provide protection to the first switch circuit and the second switch circuit.

11. The circuit of claim 10, wherein the power system comprises a charge pump circuit, the circuit and the charge pump circuit comprising an integrated circuit.

12. The circuit of claim 10, wherein said logic comprises a level shifting circuit for adjusting the control signal level to the first switch circuit and to the second switch circuit relative to the floating of at least one of the first reference signal and the second reference signal.

13. The circuit of claim 12, wherein the logic further comprises a level translation circuit coupled to the level shifting circuit, the level translation circuit providing an appropriate logic level control signal to the first switch circuit and to the second switch circuit.

14. A method comprising: (i) providing a first switch circuit for electrical coupling to a high side bus node of a floating bus and a second switch circuit for electrical coupling to a low side bus node of the floating bus, wherein the first switch circuit and the second switch circuit comprise complementary switch circuits for controlling charging of the floating bus by a power system; and (ii) providing, when in use, a first reference signal to the first switch circuit and a second reference signal to the second switch circuit, wherein the first reference signal and the second reference signal are both floating when the first switch circuit and the second switch circuit are ON; and (iii) providing a first control signal level to the first switch circuit and a second control signal level to the second switch circuit, wherein the first control signal level and the second control signal level are translated control signals relative to a value of at least one of the floating first reference signal and the floating second reference signal, to facilitate operation of the first switch circuit and the second switch circuit and provide protection thereto.

15. The method of claim 14, wherein the power system comprises a charge pump circuit and wherein the providing (i) comprises providing the first switch circuit and the second switch circuit as an integrated circuit with the charge pump circuit.

16. The method of claim 14, wherein the power system comprises a reservoir capacitor, and wherein the first reference signal comprises a potential at a first node of the reservoir capacitor and the second reference signal comprises a second potential at a second node of the reservoir capacitor.

17. The method of claim 14, wherein said providing (i) comprises providing the first switch circuit as a P type transistor and diode circuit and the second switch circuit as an N type transistor and diode circuit, and further comprising electrically coupling the first switch circuit to the high side bus node of the floating bus and the second switch circuit to the low side bus node of the floating bus.

18. A circuit comprising: a first switch circuit for electrically coupling to a high side bus node of a floating bus, and a second switch circuit for electrically coupling to a low side bus node of the floating bus, wherein the first switch circuit and the second switch circuit comprise complementary circuits for controlling charging of the floating bus by a power system; means for providing a first reference signal to the first switch circuit and a second reference signal to the second switch circuit, wherein the first reference signal and the second reference signal are both floating when the first switch circuit and the second switch circuit are ON; and means for providing a first control signal level to the first switch circuit and a second control signal level to the second switch circuit, wherein the first control signal level and the second control signal level are both translated control signals relative to a value of at least one of the floating first reference signal and the floating second reference signal, to facilitate operation of the first switch circuit and the second switch circuit and provide protection thereto.

* * * * *